(12) United States Patent
Gilda et al.

(10) Patent No.: US 10,254,961 B2
(45) Date of Patent: Apr. 9, 2019

(54) DYNAMIC LOAD BASED MEMORY TAG MANAGEMENT

(71) Applicant: INTERNATIONAL BUSINESS MACHINES CORPORATION, Armonk, NY (US)

(72) Inventors: Glenn D. Gilda, Binghamton, NY (US); Mark R. Hodges, Endicott, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/438,355

(22) Filed: Feb. 21, 2017

(65) Prior Publication Data

US 2018/0239534 A1   Aug. 23, 2018

(51) Int. Cl.
*G06F 3/06* (2006.01)
*G06F 12/00* (2006.01)
(Continued)

(52) U.S. Cl.
CPC ............ *G06F 3/0604* (2013.01); *G06F 3/067* (2013.01); *G06F 3/0659* (2013.01)

(58) Field of Classification Search
CPC ............ G06F 3/00; G06F 3/06–3/0689; G06F 5/00–5/16; G06F 9/00–9/548;
(Continued)

(56) References Cited

U.S. PATENT DOCUMENTS

| | | | | | |
|---|---|---|---|---|---|
| 4,751,638 | A | * | 6/1988 | Azuma | G06F 12/0848 711/117 |
| 5,666,505 | A | * | 9/1997 | Bailey | G06F 9/3806 712/207 |

(Continued)

OTHER PUBLICATIONS

Memory tagging in Charm++; Gioachin et al.; Proceedings of the 6th workshop on Parallel and distributed systems: testing, analysis, and debugging, Article No. 4; Jul. 20-21, 2008 (Year: 2008).*

(Continued)

*Primary Examiner* — Daniel C Chappell
(74) *Attorney, Agent, or Firm* — Cantor Colburn LLP; William Kinnaman

(57) ABSTRACT

A computer-implemented method for managing a memory control unit includes receiving a command at the memory control unit. The command includes a command type that either requires or does not require buffering resources. The method further includes determining, via the memory control unit, a number of available memory tags from a first set of memory tags that are associated with the buffering resources. The method includes determining, via the memory control unit, a number of available memory tags from a second set of memory tags that are not associated with the buffering resources. The method also includes dynamically adjusting, via the memory control unit, assignment of memory tags for use in the second set of memory tags based on the command type, the number of available memory tags from the first set of memory tags, and the number of available memory tags from the second set of memory tags.

16 Claims, 4 Drawing Sheets

(51) Int. Cl.
*G06F 13/00* (2006.01)
*G06F 13/28* (2006.01)

(58) Field of Classification Search
CPC ..... G06F 12/00–12/16; G06F 13/00–13/4295;
G06F 17/30–17/30997; G06F
21/00–21/88; G06F
2003/0691–2003/0698; G06F
2206/00–2206/20; G06F
2209/00–2209/549; G06F
2211/00–2211/902; G06F
2212/00–2212/7211; G06F
2213/00–2213/4004; G06F
2216/00–2216/17; G06F
2221/00–2221/2153
See application file for complete search history.

(56) References Cited

U.S. PATENT DOCUMENTS

| | | | | |
|---|---|---|---|---|
| 5,936,939 | A * | 8/1999 | Des Jardins | H04L 12/5602 370/229 |
| 6,434,665 | B1 * | 8/2002 | Shepherd | G06F 12/0855 711/118 |
| 7,107,367 | B1 * | 9/2006 | Hughes | G06F 13/1673 710/39 |
| 8,656,121 | B2 | 2/2014 | Guthrie et al. | |
| 9,037,811 | B2 * | 5/2015 | Gilda | G06F 13/16 710/30 |
| 9,086,803 | B2 * | 7/2015 | Ono | G06F 3/0659 |
| 9,104,564 | B2 | 8/2015 | Gilda et al. | |
| 9,318,171 | B2 | 4/2016 | Van Huben et al. | |
| 9,600,337 | B2 * | 3/2017 | Karaje | G06F 9/5011 |
| 9,747,057 | B1 * | 8/2017 | Ramani | G06F 3/0652 |
| 9,811,261 | B1 * | 11/2017 | Ramani | G06F 3/0608 |
| 2003/0182537 | A1 * | 9/2003 | Le | G06F 9/3824 712/216 |
| 2005/0154820 | A1 * | 7/2005 | Briggs | G06F 13/1673 711/105 |
| 2006/0133160 | A1 * | 6/2006 | Dickin | G06F 11/1004 365/189.05 |
| 2007/0088930 | A1 * | 4/2007 | Matsuda | G06F 12/0813 711/170 |
| 2010/0333098 | A1 * | 12/2010 | Jordan | G06F 9/384 718/103 |
| 2012/0054443 | A1 | 3/2012 | Nakra | |
| 2012/0311597 | A1 * | 12/2012 | Manula | G06F 9/5077 718/104 |
| 2013/0080679 | A1 * | 3/2013 | Bert | G06F 12/0866 711/102 |
| 2014/0164720 | A1 * | 6/2014 | Stewart | G06F 13/1647 711/157 |
| 2014/0173232 | A1 * | 6/2014 | Reohr | G06F 3/0611 711/162 |
| 2014/0281192 | A1 * | 9/2014 | Gilda | G06F 13/16 711/105 |
| 2014/0281325 | A1 * | 9/2014 | Meaney | G06F 13/1689 711/167 |
| 2014/0281653 | A1 | 9/2014 | Gilda et al. | |
| 2015/0049710 | A1 * | 2/2015 | Zhang | H04L 1/1819 370/329 |
| 2015/0074345 | A1 * | 3/2015 | Zhu | G06F 12/0871 711/103 |
| 2016/0147785 | A1 * | 5/2016 | Thirumal | G06F 17/30156 707/692 |
| 2016/0239422 | A1 | 8/2016 | Talukdar et al. | |
| 2016/0254063 | A1 * | 9/2016 | Strauss | G06F 11/1048 714/721 |
| 2016/0291884 | A1 * | 10/2016 | Halaharivi | G06F 3/0613 |
| 2016/0342530 | A1 | 11/2016 | Pellerin et al. | |
| 2017/0060467 | A1 * | 3/2017 | Leo | G06F 3/0638 |
| 2017/0132135 | A1 * | 5/2017 | Gschwind | G06F 12/0862 |
| 2017/0242755 | A1 * | 8/2017 | Litke | G06F 3/0622 |
| 2017/0344298 | A1 * | 11/2017 | Shih | G06F 3/0631 |
| 2018/0027062 | A1 * | 1/2018 | Bernat | H03M 7/40 709/224 |
| 2018/0107390 | A1 * | 4/2018 | Bae | G06F 3/0604 |

OTHER PUBLICATIONS

Filtering dirty data in DRAM to reduce PRAM writes; Park et al.; IFIP/IEEE International Conference on Very Large Scale Integration; Oct. 5-7, 2015 (Year: 2015).*

WildFire: a scalable path for SMPs; Hagersten et al.; Proceedings Fifth International Symposium on High-Performance Computer Architecture; Jan. 9-13, 1999 (Year: 1999).*

Efficient Tagged Memory; Joannou et al.; IEEE International Conference on Computer Design; Nov. 5-8, 2017 (Year: 2017).*

Meaney, et al., "The IBM z13 memory subsystem for big data", IBM Journal of Research and Development, IBM J. Res. & Dev. vol. 59 No. 4/5 Paper Jul. 4/Sep. 2015, 11 Pages, IEEE Xplore Digital Library. DOI: 10.1147/JRD.2015.2429031.

IBM, "Powers Processor SCM and Memory Buffer Hardware Errata Notice DD 2.x", Version 1.6, Aug. 30, 2016, 27 Pages, IBM Systems, Somers, NY.

IBM, "Power Architecture 64-Bit ELF V2 ABI Specification", OpenPOWER ABI for Linux Supplement, Jun. 13, 2016, Version 1.2, 245 Pages, IBM Systems, Somers, NY.

* cited by examiner

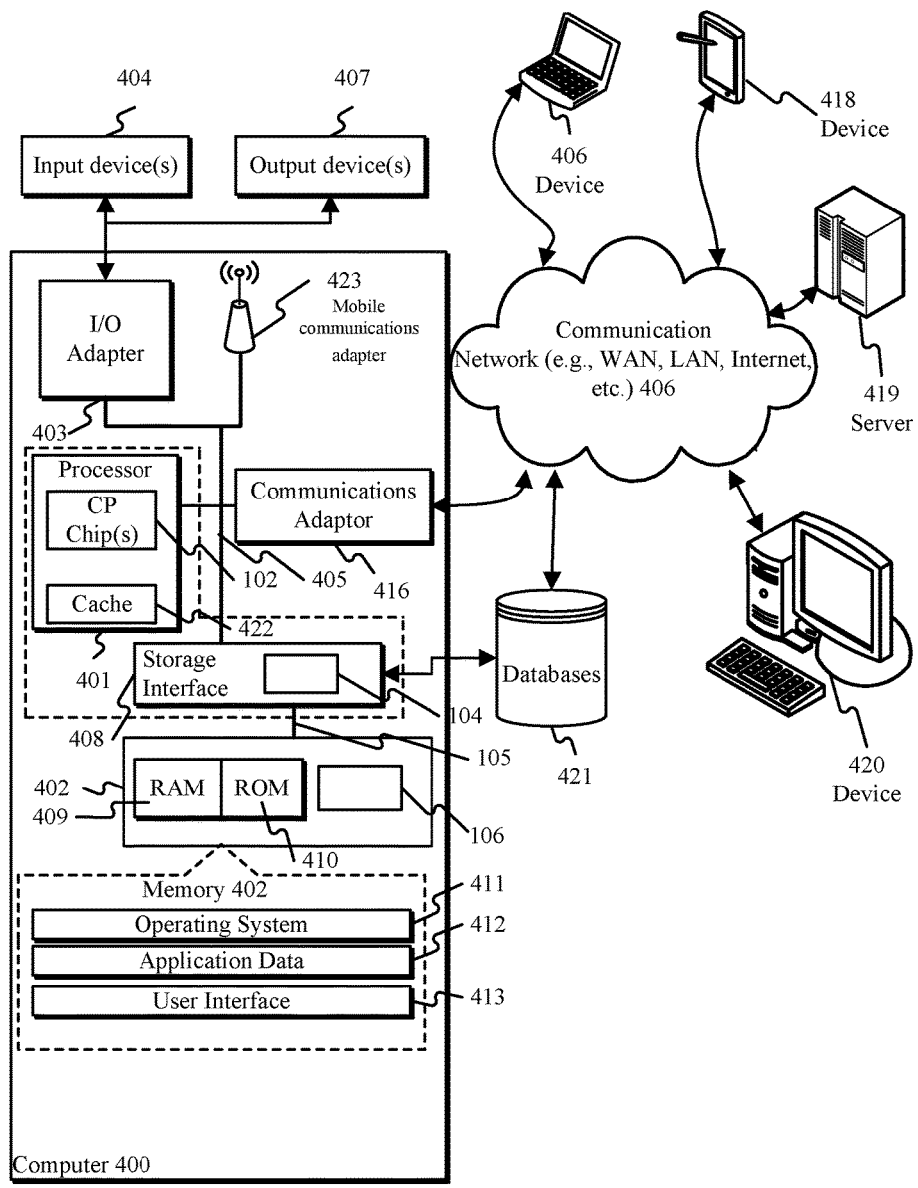
FIG. 4: Exemplary Computer

DYNAMIC LOAD BASED MEMORY TAG MANAGEMENT

BACKGROUND

The present disclosure relates to memory management systems, and more specifically, to dynamic load-based memory tag management.

In computer and mainframe memory systems a protocol can be used across the memory channels in a memory control unit to send fetch and store commands to a memory buffer chip that interfaces to dynamic random access memory (DRAM) chips that include double data rate (DDR) memory. The protocol involves returning data and/or completion status to the memory controller for these commands. System performance can be limited under certain system work load conditions. For example, if there is a period of time where data stores dominate the traffic to memory, the amount of pre-allocated tags available to stores may be used up and limit the number of outstanding stores. This can limit store bandwidth to memory if the round-trip time for returning store completions (thus freeing up store tags) exceeds the time that it takes to transfer data from the memory controller to the memory buffer chip for the number of store tags available.

SUMMARY

According to an embodiment of the present invention, a computer-implemented method for managing a memory control unit is described. The method includes receiving a command at the memory control unit. The command includes a command type which either requires or does not require buffering resources. The method further includes determining, via the memory control unit, a number of available memory tags from a first set of memory tags that are associated with buffering resources. The method includes determining, via the memory control unit, a number of available memory tags from a second set of memory tags that are not associated with buffering resources. The method also includes dynamically adjusting, via the memory control unit, an assignment of memory tags for use in the second set of memory tags based on the command type, the number of available memory tags from the first set of memory tags, and the number of available memory tags from the second set of memory tags.

According to other embodiments, a system for managing a memory controller is described. The system includes a memory control unit. The memory control unit is configured to receive a command. The command includes a command type that either requires or does not require buffering resources. The memory control unit is configured to determine a number of available memory tags from a first set of memory tags that are associated with buffering resources. The memory control unit is also configured to determine a number of available memory tags from a second set of memory tags that are not associated with buffering resources. The memory control unit is further configured to dynamically adjust an assignment of memory tags for use in the second set of memory tags based on the command type, the number of available memory tags from the first set of memory tags, and the number of available memory tags from the second set of memory tags.

According to yet other embodiments, a computer program product for managing a memory control unit is described. The computer program product includes a computer readable storage medium having program instructions embodied therewith. The program instructions are executable by a memory the control unit to cause the memory control unit to perform a method. The method includes receiving a command at the memory control unit. The command includes a command type which either requires or does not require buffering resources. The method further includes determining, via the memory control unit, a number of available memory tags from a first set of memory tags that are associated with buffering resources. The method includes determining, via the memory control unit, a number of available memory tags from a second set of memory tags that are not associated with buffering resources. The method also includes dynamically adjusting, via the memory control unit, an assignment of memory tags for use in the second set of memory tags based on the command type, the number of available memory tags from the first set of memory tags, and the number of available memory tags from the second set of memory tags.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 depicts a block diagram of a computer system and environment, according to one or more embodiments.

DETAILED DESCRIPTION

Figure 1:
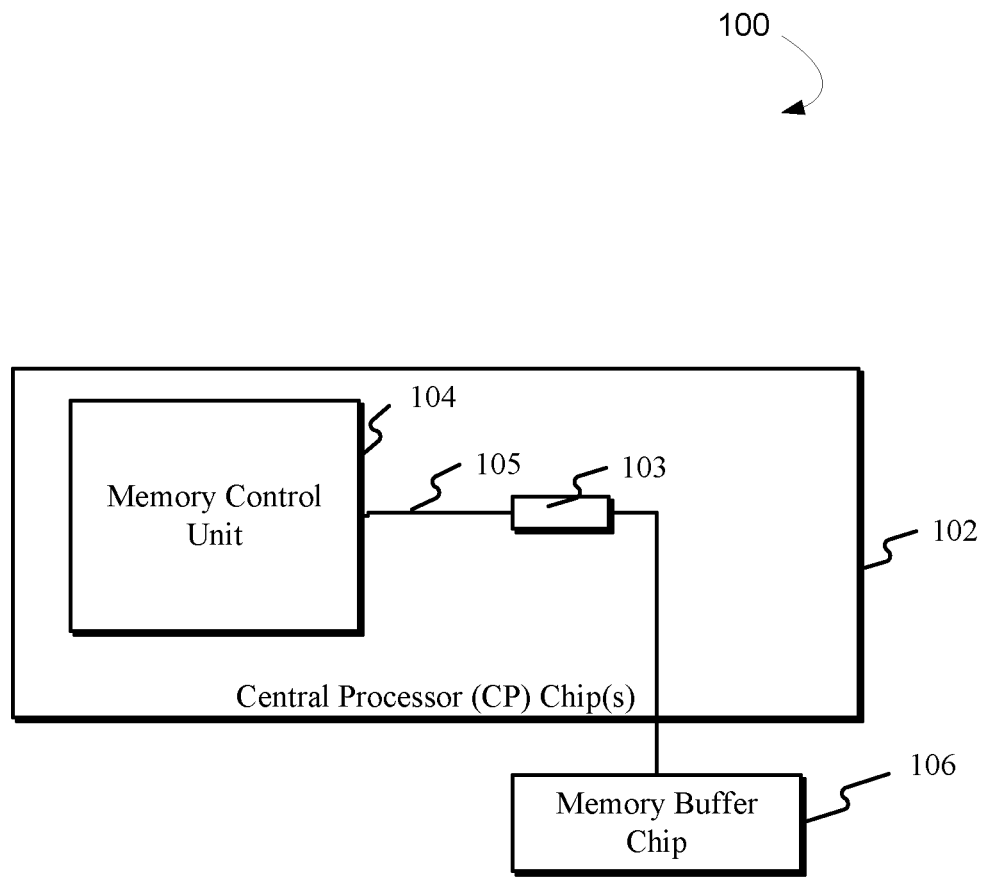
FIG. 1 depicts a system for managing a memory, according to one or more embodiments.

Memory controllers may allocate memory tags in a predetermined fashion by command type. For example, a memory controller may additionally contain fetch data buffers that are used to temporarily hold data returned to the memory controller from the memory buffer chip until it can be passed onto a cache or processor. The memory tags can then be used as addresses into these buffers so that data can be located in these buffers in a straightforward manner and with minimal latency. A group of tags is then assigned as a design decision to fetches to correspond to the available fetch data buffer space, and the remainder is assigned to stores and other operations.

While this arrangement offers advantages from the perspective of both design simplicity and direct access to data held in fetch data buffers, it can also limit system performance under certain system load conditions. If there is a period of time where stores dominate the traffic to memory, the amount of pre-allocated tags available to stores may be used up and limit the number of outstanding stores. This can limit store bandwidth to memory if the round-trip time for returning store completions (thus freeing up store tags) exceeds the time that it takes to transfer data from the memory controller to the memory buffer chip for the number of store tags available. For example, a typical round-trip latency from the launch of a store command from a central processor (CP) chip to when completion status is returned by a memory buffer chip may be approximately 40 ns in a best case scenario. 128 byte stores may take up 3.33 ns to transmit on the memory channel, so the overall capacity of the channel is 40/3.33=12 stores. For a system with only 8 tags available for stores, only ⅔ of the available bandwidth is utilized for 128 byte stores. While this example considers a system with only 8 tags available for stores and 3.33 ns transmission latency per 128 byte store, it is appreciated that the number of tags, transmission latency and data length in the example may be scaled up or down for other systems.

In some aspects, the first set of memory tags may be associated with fetch command types, and the second set of memory tags may be associated with store command types. The first set are used for operations that require data buffering resources. For example, according to one embodiment, the first set of memory tags are associated with dedicated data buffering used for temporarily storing data returned from the one or more memory buffer chips in response to one or more of memory buffer chips having previously received a fetch command type. In other aspects, the second set of memory tags are not associated with data buffering and are used for operations such as store command types that do not require data buffering resources.

Embodiments of the present invention may allow tags allocated only for use by fetches to be used instead by stores under certain conditions. In some aspects, if a condition is detected in the memory controller where all store tags are in use, and some subset of fetch tags are currently not in use, then use of this subset of fetch tags may be transferred over for use by stores, thereby increasing store bandwidth available going out to the memory buffer chip. In other aspects of the present invention, if the number of store tags in use drops below a certain threshold, or the number of fetch tags used reaches another threshold, then the system may return these additional store tags back to the pool of tags available for fetches. The allocation and de-allocation of this subset of fetch tags for use by stores can occur dynamically based on load conditions. Additionally, according to some embodiments, the thresholds can be adjusted dynamically in response to workload conditions.

Now considering embodiments of the present invention in greater detail, FIG. 1 depicts a system 100 for managing a memory. System 100 includes a central processor 102 and one or more memory buffer chips 106 (referred to hereafter as "memory buffer chip 106"). Central processor 102 includes a memory control unit 104. Memory buffer chip 106 can be, for example, part of a dual inline memory module (DIMM), or attached other types or configurations of computer memory. For example, the memory buffer chip may be mounted on a system backplane and attached to industry-standard DIMMs. Memory buffer chip 106, although shown herein as a single chip, may include multiple chips operatively connected to memory control unit 104 via memory channels 105. Control unit 104 may operate as part of processor 401 (shown in FIG. 5) or may operate as an independent processor.

Memory tags 103 may be transmitted between the memory control unit 104 and one or more memory buffer chips 106 via one or more memory channels 105. Memory tags 103 may be transmitted as part of commands sent from the memory control unit 104, data being returned from the memory buffer chip 106, and completion status being returned from the memory buffer chip 106. The memory tags 103 may uniquely identify individual fetch and store commands as they are sent to the memory buffer chip 106. In conventional systems, memory tags are a fixed number of bits (set as a design decision) and limit how many simultaneous operations can be in progress between the control unit 104 and the memory buffer chip 106. In accordance with some embodiments, it is advantageous to dynamically allocate and de-allocate the memory tags with the memory controller based on the number of tags used, the type of resources required by the memory tags and memory workload conditions.

Figure 2:
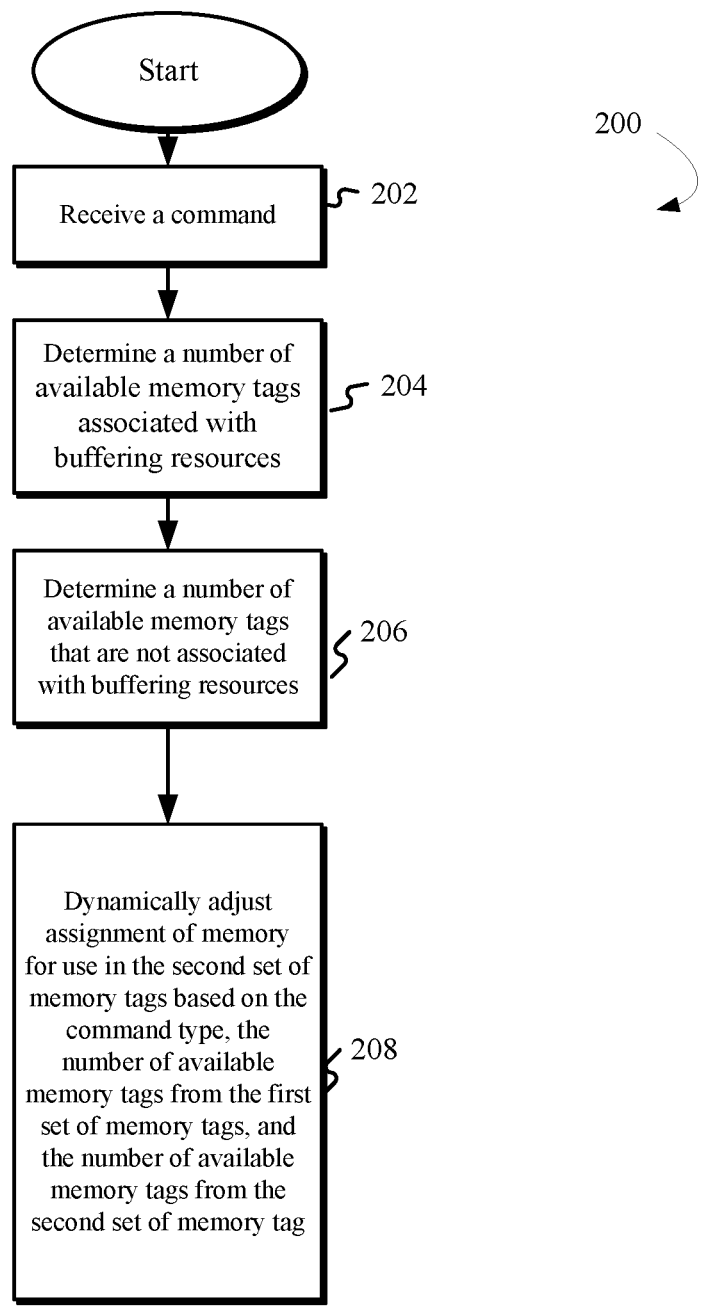
FIG. 2 depicts a method for managing a memory control unit, according to one or more embodiments.

FIG. 2 depicts a method 200 for managing control unit 104, according to one or more embodiments. Referring now to FIG. 2, as shown in block 202, memory control unit 104 (hereafter control unit 104) may receive a command having a command type. According to one or more embodiments, the command type determines whether or not buffering resources are needed for the command.

As shown in block 204, control unit 104 may determine a number of available memory tags 103 that are associated with buffering resources.

Control unit 104 can include one or more fetch data buffer (not shown) configured to temporarily hold data returned to control unit 104 from buffer chip 106 until it can be passed onto a cache or processor (e.g., cache 422 or processor 401, shown with respect to FIG. 4). Control unit 104 may then use memory tags 103 as addresses of data buffer locations so that data can be stored into these buffers in a straightforward manner and with minimal latency. A remainder of the memory tags in use (a second set of memory tags not associated with data buffers) may be assigned to data stores and other operations.

In some aspects, a memory tag may serve two purposes: one as an identifier to match data or completion status returned from the memory buffer chips 106 with the command that was originally sent by control unit 104, and the other is as a pointer into one or more data buffers. As shown in block 206, control unit 104 may determine a number for a second set of memory tags that do not require data buffering resources. Accordingly, control unit 104 may take a count of tags in the second set that are available for use. The second set of memory tags do not require dedicated data buffering for data returned from the one or more memory buffer chips 106 because they have been assigned for data store operations, which do not require dedicated data buffering resources in control unit 104. Control unit 104 can determine whether a memory tag is available based on the tag's completion status. The completion status is received from one or more memory buffer chips 106 and indicates a memory tag previously allocated (or in use) to a command is now available for re-use. Once a memory tag is made available for re-use, it becomes part of a pool (sub-set) of available memory tags that can be allocated to incoming commands.

As shown in block 208, control unit 104 may dynamically adjust assignment of memory tags for use in the second set of memory tags based on a command type (i.e., fetch or store) coming from processor 401 and memory tag availability in both sets. For example, control unit 104 may determine whether the number of the second set of memory tags in use exceeds a first threshold. The command type (i.e. fetch or store) coming from processor 401 determines whether a data buffer residing in the control unit 104 is needed or not. Data buffers in the control unit 104 have a direct association with memory tag values. According to some embodiments, the subset of memory tags associated with fetch data buffers can now be used for multiple purposes (e.g., for fetch data as in the first set of memory tags, and used for store data as part of the second set of memory tags) instead of being fixed permanently for exclusive use by fetch data buffers for fetches.

A threshold may be a predetermined number, which can be selected as a function of design choice. According to embodiments several thresholds for numbers of memory tags are determined. The threshold numbers may be dynamically set by control unit 104 based on workload and other operational factors. Accordingly, control unit 104 may determine whether the number of the first set of memory tags in use does not exceed a second threshold indicative of a number of memory tags in use for fetch operations, and determine whether the number of the second set of memory tags in use does exceed (or stated another way, is above) a first threshold indicative of a number of memory tags in use. When both threshold tests are met, control unit 104 may reassign some portion (a sub-set) of those available memory tags to the second set to be used for store operations.

In some aspects, control unit 104 may determine the number of tags to include in the subset. This number may be fixed by the design of control unit 104, or there may be a register that defines the number of tags that belong to the subset. For example, a register may define a starting tag number and an ending tag number that belong the subset.

In one or more embodiments, control unit 104 may return the subset of the second set of memory tags for use by the one or more command types associated with the first set of memory tags when the second set of memory tags in use have fallen below a third threshold. The third threshold sets a minimum number for memory tags in use as part of the second set. Although the first, second, and third thresholds may initially be set as a matter of design choice, according to some embodiments, control unit 104 may add registers that allow changing the threshold values. Accordingly, control unit 104 may add registers that allow changing the first threshold and the second threshold values in response to real-time load conditions. For example, if control unit detects greater congestion in memory traffic, a third threshold value may be adjusted by control unit 104.

Figure 3:
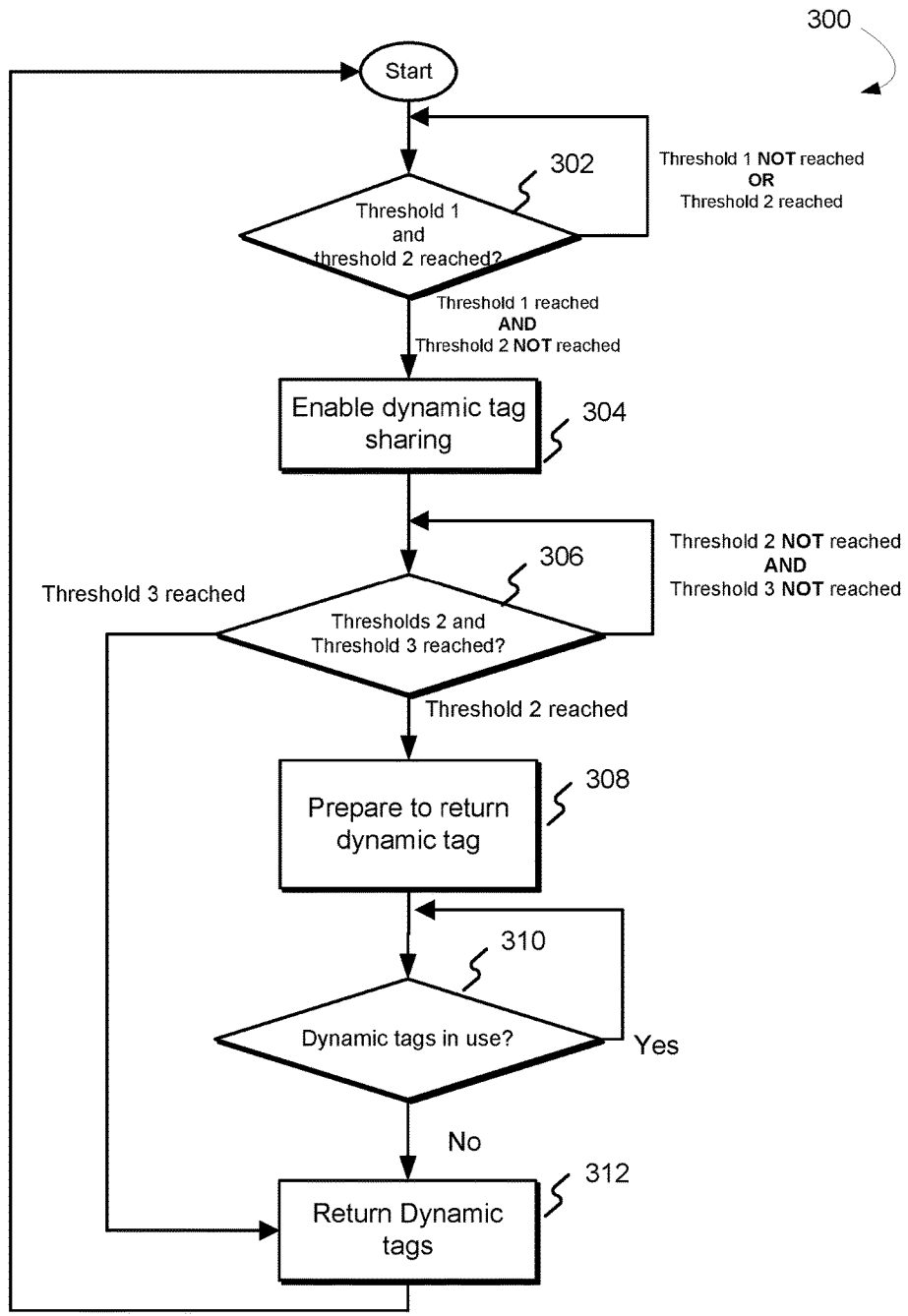
FIG. 3 depicts a method for allocating memory tags, according to one or more embodiments.

FIG. 3 depicts a flow diagram a method 300 for dynamically allocating memory tags, according to one or more embodiments. Referring now to FIG. 3, after an initial starting step, as shown in decision block 302, control unit 104 may determine whether the first threshold and the second threshold have been reached. Control unit 104 may remain in this state until a first threshold is reached without meeting a second threshold. The first threshold indicates that a predetermined number of tags are in use for a second set and more may be needed to optimize the performance of system 100. The second threshold tests if another predetermined number of memory tags are in use for the first set.

If the first threshold is met and the second threshold is not, control unit 104 may enable dynamic tag sharing in control unit 104, as shown in block 304. Control unit 104 may make a subset of tags from the first set of memory tags (also referred to as "dynamic tags") available for exclusive use as part of the second set of memory tags.

As shown in decision block 306, control unit 104 may remain in the present state until one of two events occurs: First, control unit 104 may remain in the present state until the second threshold is reached, in which case control unit 104 will transition to preparing to return the dynamic tags, as shown in block 308. Second, control unit 104 may also remain in the present state until a third threshold is reached. The third threshold indicates that the number of tags used in the second set of memory tags has fallen below another predetermined number, in which case control unit 104 may transition to returning dynamic tags as shown in block 312.

At block 312, the control unit 104 may stop any further allocation of dynamic tags to operations using the second set of memory tags and return to the starting operation.

Referring again to block 308, control unit 104 will stop allocating any dynamic tags to any new operations. Control unit 104 then determines whether there are any dynamic tags remaining in use, as shown in decision block 310. The control unit 104 will hold the current state until such time as there are no longer any dynamic tags in use by the system. Accordingly, control unit 104 may return the dynamic tag subset for use by operations that use the first set of tags, as shown in block 312, and return to again to the starting state of method 300.

FIG. 4 illustrates a block diagram of an exemplary computing environment and computer 400 for use in practicing the embodiments described herein. The environment and system described herein can be implemented in hardware, software (e.g., firmware), or a combination thereof. In an exemplary embodiment, a hardware implementation may include a microprocessor of a special or general-purpose digital computer, such as a personal computer, workstation, minicomputer, or mainframe computer. Computer 400 therefore can embody a general-purpose computer.

As shown in FIG. 4, the computer 400 includes processor 401. Computer 400 also includes memory 402 communicatively coupled to processor 401, and one or more input/output adapters 403 that may be communicatively coupled via system bus 405. Memory 402 may be communicatively coupled to one or more internal or external memory devices via a storage interface 408. In one embodiment, storage interface 408 and processor 401 are on the same chip. In another embodiment, storage interface 408 and processor 401 may be on separate chips. Storage interface 408 may include memory control unit 104, and may be operatively connected with memory buffer chip 106 via memory channel 105.

Communications adapter 416 may communicatively connect computer 400 to one or more networks 406. System bus 405 may communicatively connect one or more user interfaces via input/output (I/O) adapter 403. I/O adapter 403 may connect a plurality of input devices 404 to computer 400. Input devices may include, for example, a keyboard, a mouse, a microphone, a sensor, etc. System bus 405 may also communicatively connect one or more output devices 407 via I/O adapter 403. Output device 407 may include, for example, a display, a speaker, a touchscreen, etc.

Processor 401 is a hardware device for executing program instructions (aka software), stored in a computer-readable memory (e.g., memory 402). Processor 401 may include portions of system 100 as shown in FIG. 100. Processor 401 can be a plurality of CPUs, an auxiliary processor among several other processors associated with the computer 400, a semiconductor based microprocessor (in the form of a microchip or chip set), or generally any device for executing instructions. Processor 401 can include a cache memory 422, which may include, but is not limited to, an instruction cache to speed up executable instruction fetch, a data cache to speed up data fetch and store, and a translation lookaside buffer (TLB) used to speed up virtual-to-physical address translation for both executable instructions and data. Cache memory 422 may be organized as a hierarchy of more cache levels (L1, L2, etc.).

Processor 401 may be disposed in communication with one or more memory devices (e.g., RAM 409, ROM 410, memory buffer chip 106, one or more external databases 421, etc.) via a storage interface 408. Storage interface 408 may also connect to one or more memory devices including, without limitation, memory 402, one or more databases 421, and/or one or more other memory drives (not shown) including, for example, a removable disc drive, etc., employing connection protocols such as serial advanced technology attachment (SATA), integrated drive electronics (IDE), IEEE-1394, universal serial bus (USB), fiber channel, small computer systems interface (SCSI), etc. The memory drives may be, for example, a drum, a magnetic disc drive, a magneto-optical drive, an optical drive, a redundant array of independent discs (RAID), a solid-state memory device, a solid-state drive, etc.

Memory 402 can include random access memory (RAM) 409 and read only memory (ROM) 410, and one or more memory buffer chips 106. RAM 409 can be any one or combination of volatile memory elements (e.g., DRAM, SRAM, SDRAM, etc.). ROM 410 can include any one or more nonvolatile memory elements (e.g., erasable programmable read only memory (EPROM), flash memory, electronically erasable programmable read only memory (EEPROM), programmable read only memory (PROM), tape, compact disc read only memory (CD-ROM), disk, cartridge, cassette or the like, etc.). Moreover, memory 402 may incorporate electronic, magnetic, optical, and/or other types of non-transitory computer-readable storage media. Memory 402 may also be a distributed architecture, where various components are situated remote from one another, but can be accessed by processor 401. According to one or more embodiments, memory 402 includes one or more memory buffer chips 106.

The instructions in memory 402 may include one or more separate programs, each of which may include an ordered listing of computer-executable instructions for implementing logical functions. In the example of FIG. 4, the instructions in memory 402 may include an operating system 411. Operating system 411 can control the execution of other computer programs and provides scheduling, input-output control, file and data management, memory management, and communication control and related services.

The program instructions stored in memory 402 may further include application data 412, and for a user interface 413.

I/O adapter 403 can be, for example but not limited to, one or more buses or other wired or wireless connections. I/O adapter 403 may have additional elements (which are omitted for simplicity) such as controllers, microprocessors, buffers (caches), drivers, repeaters, and receivers, which may work in concert to enable communications. Further, I/O adapter 403 may facilitate address, control, and/or data connections to enable appropriate communications among the aforementioned components.

I/O adapter 403 can further include a display adapter coupled to one or more displays. I/O adapter 403 may be configured to operatively connect one or more input/output (I/O) devices 407 to computer 400. For example, I/O 403 may connect a keyboard and mouse, a touchscreen, a speaker, a haptic output device, or other output device. Output devices 407 may include but are not limited to a printer, a scanner, and/or the like. Other output devices may also be included, although not shown. Finally, the I/O devices connectable to I/O adapter 403 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like.

According to some embodiments, computer 400 may include a mobile communications adapter 423. Mobile communications adapter 423 may include GPS, cellular, mobile, and/or other communications protocols for wireless communication.

In some embodiments, computer 400 can further include communications adapter 416 for coupling to a network 406.

Network 406 can be an IP-based network for communication between computer 400 and any external device. Network 406 transmits and receives data between computer 400 and devices and/or systems external to computer 400. In an exemplary embodiment, network 406 can be a managed IP network administered by a service provider. Network 406 may be a network internal to an aircraft, such as, for example, an avionics network, etc. Network 406 may be implemented in a wireless fashion, e.g., using wireless protocols and technologies, such as WiFi, WiMax, etc. Network 406 may also be a wired network, e.g., an Ethernet network, an ARINC 429 network, a controller area network (CAN), etc., having any wired connectivity including, e.g., an RS232 connection, R5422 connection, etc. Network 406 can also be a packet-switched network such as a local area network, wide area network, metropolitan area network, Internet network, or other similar type of network environment. The network 406 may be a fixed wireless network, a wireless local area network (LAN), a wireless wide area network (WAN) a personal area network (PAN), a virtual private network (VPN), intranet or other suitable network system.

Network 406 may operatively connect computer 400 to one or more devices including device 417, device 418, and device 420. Network 406 may also connect computer 400 to one or more servers such as, for example, server 419.

If computer 400 is a PC, workstation, laptop, tablet computer and/or the like, the instructions in the memory 402 may further include a basic input output system (BIOS) (omitted for simplicity). The BIOS is a set of routines that initialize and test hardware at startup, start operating system 411, and support the transfer of data among the operatively connected hardware devices. The BIOS is typically stored in ROM 410 so that the BIOS can be executed when computer 400 is activated. When computer 400 is in operation, processor 401 may be configured to execute instructions stored within the memory 402, to communicate data to and from the memory 402, and to generally control operations of the computer 400 pursuant to the instructions.

Embodiments of the present invention may improve bandwidth memory in computing systems during a period of time where stores dominate the traffic to memory. Some embodiments improve performance of the memory when the amount of pre-allocated tags available to stores are used up and limit the number of outstanding stores. Embodiments may streamline bandwidth to memory by eliminating system errors and/or latency if the round-trip time for returning store completions exceeds the time that it takes to transfer data from the memory controller to the memory buffer chip for the number of store tags available.

Embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the memory control unit of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A computer-implemented method for managing a memory control unit comprising:
receiving a command at the memory control unit, wherein the command comprises a command type that either requires or does not require buffering resources;

determining, via the memory control unit, a number of available memory tags from a first set of memory tags that are associated with the buffering resources;

determining, via the memory control unit, a number of available memory tags from a second set of memory tags that are not associated with the buffering resources;

dynamically adjusting, via the memory control unit, an assignment of memory tags for use in the second set of memory tags based on the command type, the number of available memory tags from the first set of memory tags, and the number of available memory tags from the second set of memory tags, wherein dynamically adjusting the assignment of the memory tags for use in the second set of memory tags comprises:

determining, via the memory control unit, whether the number of the second set of memory tags exceeds a first threshold indicative of a number of memory tags in use; and determining, via the memory control unit, whether the number of the first set of memory tags exceeds a second threshold indicative of a number of memory tags in use; and preventing any further allocation of a subset of the second set of memory tags when the first set of memory tags have exceeded the second threshold indicative of a number of memory tags in use.

2. The computer-implemented method of claim 1, further comprising:

making, via the memory control unit, a subset of the first set of memory tags available for allocation by command types associated with the second set of memory tags when the number of the second set of memory tags in use exceeds the first threshold and the number of tags from the first set of memory tags in use does not exceed the second threshold.

3. The computer-implemented method of claim 2, comprising returning the subset of the second set of memory tags for use by the command type associated with the second set of memory tags when the second set of memory tags in use have fallen below a third threshold indicative of the number of memory tags in use.

4. The computer-implemented method of claim 1, wherein the first set of memory tags is associated with fetch command types and the second set of memory tags is associated with store command types.

5. The computer-implemented method of claim 4, wherein the first set of memory tags requires dedicated data buffering for data returned from one or more memory buffer chips, and the second set of memory tags does not require data buffering for data returned from one or more memory buffer chips.

6. The computer-implemented method of claim 5, further comprising:

adding, via the memory control unit, registers in the memory control unit that change a first threshold and a second threshold.

7. The computer-implemented method of claim 6, further comprising:

adding, via the memory control unit, the registers in the memory control unit that change the second threshold based on real-time load conditions.

8. A system for managing a memory comprising:

a memory control unit configured to:

receive a command, wherein the command comprises a command type that either requires or does not require buffering resources;

determine a number of available memory tags from a first set of memory tags that are associated with the buffering resources;

determine a number of available memory tags from a second set of memory tags that are not associated with the buffering resources;

dynamically adjust an assignment of memory tags for use in the second set of memory tags based on the command type, the number of available memory tags from the first set of memory tags, and the number of available memory tags from the second set of memory tags, wherein the memory control unit is configured to dynamically adjust the assignment of the memory tags for use in the second set of memory tags by:

determining, via the memory control unit, whether the number of the second set of memory tags exceeds a first threshold indicative of a number of memory tags in use; and determining, via the memory control unit, whether the number of the first set of memory tags exceeds a second threshold indicative of a number of memory tags in use; and prevent any further allocation of a subset of the second set of memory tags when the first set of memory tags have exceeded the second threshold indicative of a number of memory tags in use.

9. The system of claim 8, wherein the memory control unit is further configured to:

make a subset of the first set of memory tags available for allocation by command types associated with the second set of memory tags when the number of the second set of memory tags in use exceeds the first threshold and the number of tags from the first set of memory tags in use does not exceed the second threshold.

10. The system of claim 9, wherein the memory control unit is further configured to return the subset of the second set of memory tags for use by the command type associated with the second set of memory tags when the second set of memory tags in use have fallen below a third threshold indicative of the number of memory tags in use.

11. The system of claim 8, wherein the first set of memory tags is associated with fetch command types and the second set of memory tags is associated with store command types.

12. The system of claim 11, wherein the first set of memory tags requires dedicated data buffering for data returned from one or more memory buffer chips, and the second set of memory tags does not require data buffering for data returned from one or more memory buffer chips.

13. The system of claim 8, wherein the memory control unit is configured to:

add registers in the memory control unit that change a first threshold and a second threshold.

14. The system of claim 8, wherein the memory control unit is configured to prevent any further allocation of when the second set of memory tags have fallen below a third threshold indicative of available memory tags.

15. The system of claim 11, wherein the memory control unit is configured to:

add registers in the memory control unit that change the first threshold and the second threshold in response to real-time load conditions; and add a register in the memory control unit that defines the number of tags in a subset of the first set of memory tags available for allocation by command types associated with the second set of memory tags.

16. A computer program product for managing a memory control unit comprising, the computer program product comprising a non-transitory computer readable storage medium having program instructions embodied therewith, the program instructions executable by a memory control unit to cause the memory control unit to perform a method comprising:
- receiving a command at the memory control unit, wherein the command comprises a command type that either requires or does not require buffering resources;
- determining, via the memory control unit, a number of available memory tags from a first set of memory tags that are associated with the buffering resources;
- determining, via the memory control unit, a number of available memory tags from a second set of memory tags that are not associated with the buffering resources;
- dynamically adjusting, via the memory control unit, an assignment of memory tags for use in the second set of memory tags based on the command type, the number of available memory tags from the first set of memory tags, and the number of available memory tags from the second set of memory tags, wherein dynamically adjusting the assignment of the memory tags for use in the second set of memory tags comprises:
  - determining, via the memory control unit, whether the number of the second set of memory tags exceeds a first threshold indicative of a number of memory tags in use; and
  - determining, via the memory control unit, whether the number of the first set of memory tags exceeds a second threshold indicative of a number of memory tags in use; and
- preventing any further allocation of a subset of the second set of memory tags when the first set of memory tags have exceeded the second threshold indicative of a number of memory tags in use.

* * * * *